United States Patent [19]

Tsuno

[11] 4,384,208
[45] May 17, 1983

[54] ELECTRON LENS EQUIPPED WITH THREE MAGNETIC POLE PIECES

[75] Inventor: Katsushige Tsuno, Tokyo, Japan

[73] Assignee: Jeol Ltd., Tokyo, Japan

[21] Appl. No.: 220,183

[22] Filed: Dec. 23, 1980

[30] Foreign Application Priority Data

Dec. 28, 1979 [JP] Japan ................................ 54-172796

[51] Int. Cl.³ ............................................. G01N 23/00
[52] U.S. Cl. ............................................. 250/396 ML
[58] Field of Search ......................... 250/396 ML, 311

[56] References Cited

U.S. PATENT DOCUMENTS

2,859,363 11/1958 Leisegang et al. .......... 250/396 ML
2,976,457 3/1961 Reisner ......................... 250/396 ML
4,219,732 8/1980 Nakagawa et al. .......... 250/396 ML

FOREIGN PATENT DOCUMENTS

55-121257 9/1980 Japan .......................... 250/396 ML

*Primary Examiner*—Bruce C. Anderson
*Attorney, Agent, or Firm*—Webb, Burden, Robinson & Webb

[57] ABSTRACT

An electron lens equipped with three magnetic pole pieces defining two gaps forms two magnetic fields. The magnetic fields are generated in said gaps by opposite and same strength excitation. The bore diameters of the middle and lower magnetic pole pieces are equal and the bore diameter of the upper magnetic pole piece is 1.5 to 5 times larger than those of the middle and lower magnetic pole pieces, so that radial (isotropic) distortion is eliminated and spiral (anisotropic) distortion is extremely reduced.

5 Claims, 7 Drawing Figures

ELECTRON LENS EQUIPPED WITH THREE MAGNETIC POLE PIECES

BACKGROUND

This invention relates to an electron lens which can reduce both radial and spiral distortions in a transmission electron microscope.

The aberrations which must be carefully avoided in the design of a projector lens for an electron microscope include radial distortion, spiral distortion, chromatic aberration of rotation, and chromatic aberration of magnification. The radial (isotropic) distortion, which presents a more important problem than any other kind of aberration, can be substantially eliminated in a low magnification range where the projector lens is magnetized with less lens excitation, by virtue of the so-called distortion-free system (U.S. Pat. No. 3,188,465) in which a higher barrel type distortion is created in an intermediate lens to cancel a pin cushion type distortion caused by the projector lens. In a medium magnification range where a fixed amount of electric current is applied to the projector lens, however, no such cancelling can be expected since the pin cushion type distortion caused by the projector lens is overwhelmingly greater than the barrel type distortion caused by the intermediate lens, there is inevitably a distortion of, say, 1 to 2% along the circumference of a circle having a diameter of 100 mm on a fluorescent screen.

There has hitherto been no effective method for eliminating spiral (anisotropic) distortion; all that has been done in the past was to make the distance between a projector lens and a film surface as long as possible, and utilize only the electron beams passing in the vicinity of the central axis, so that the aberration may not easily be noticeable. According to this method, however, it is difficult to reduce the aberration to a level of 2% or less, because it is not adapted to basically reduce the aberration, and also because certain spatial restrictions are imposed on the apparatus which is available for carrying out the method.

It has recently been proposed to use as a projector lens a lens equipped with three magnetic pole pieces defining two gaps of opposite excitation, and this lens has been found capable of eliminating radial distortion completely. It has also been found that this lens can reduce spiral distortion to a level not possible by any other type lens. The lens, however, does not eliminate spiral distortion completely, and if it is desired to achieve a low spiral distortion of 1% or less, there is no alternative but to use the lens in a range of lens excitation in which radial distortion increases.

FIG. 1 is a view showing schematically the electron lens proposed prior to this invention. In the figure, two excitation coils 1 and 2, which are connected in series and supplied with the current (I) from a lens power supply 3, are enveloped by a ferromagnetic yoke 4 and non-ferromagnetic spacers 5 and 6. Inside the yoke, the upper pole piece 7, middle pole piece 8 and lower pole piece 9 and their non-ferromagnetic spacers 10 and 11 are installed. The shape of the lens is nearly symmetrical with respect to the center of the middle pole piece. The upper d1, middle d2, and lower d3 pole piece bore diameters are all 3 mm, and the first gap length S1 between the upper and middle pole pieces is equal to the second gap length S2 between the middle and lower pole pieces. The turn number (N) of each lens coil, 1 and 2, is the same and the winding direction of each coil is determined so that polarity of the magnetic field appearing in the first and second gaps is opposite to each other and the magnetic field appering in the first and second gaps is generated by the same excitation intensity.

FIG. 2 shows the focal length fp (mm), radial distortion $\Delta r/r$ (%) and spiral distortion $\Delta S/r$ (%) of the lens shown in FIG. 1 in relation to the excitation (magnetomotive force) NI (amper turns), using the thickness t of the middle pole piece 2 as a parameter. The graph shown refers to a lens having an equal bore diameter d1, d2 or d3 of 3 mm, an equal pole gap length S1 or S2 of 2.25 mm, and a middle pole piece thickness t of 1 mm and 2 mm. The graph shown is obtained under the condition in which accelerating voltage of the electron beam equals 100 KV. In the event that accelerating voltage does not equal 100 KV, the following conversion equation is established $$\frac{(NI)_{100KV}}{\sqrt{109785}} = \frac{NI}{\sqrt{V^*}}$$

where:
$V^*$ ... Accelerating voltage (V) of the electron beam corrected by "principle of relativity"
(NI) ... Value of NI (ampere turns) in the case that accelerating voltage of the electron beam equal $V^*$.
$(NI)_{100\ KV}$ ... Value of NI (ampere turns) in FIG. 2.

A is noted from FIG. 2, the focal length fp shows a minimum value at the excitation NI of 2,200 and 1,800 AT (ampere turns) when the middle pole thickness t is 1 mm and 2 mm, respectively. The minimum values of the focal length are 3.8 mm, and 4.6 mm when the thickness t is 1 mm and 2 mm, respectively. It is, thus, noted that a lens having a smaller thickness t of the middle pole piece has a smaller minimum value of focal length. The radial distortion $\Delta r/r$ shows a positive value (pin cushion type) on the low excitation side, and a negative value (barrel type) on the high excitation side. The excitation value at which the radial distortion becomes zero is substantially equal to that at which the focal length fp shows an extremely small value on the low excitation side and a sharp increase with an increase in the excitation, and there is no situation in which the spiral distortion becomes zero. Accordingly, if the radial distortion $\Delta r/r$ is zero or in a very low range, the spiral distortion $\Delta S/r$ cannot be reduced to zero.

If different amounts of excitation are applied to form magnetic fields in the two gaps between the magnetic pole pieces in the lens constructed as shown in FIG. 1, it is possible to eliminate any spiral distortion at certain amounts of excitation, but other defects, such as chromatic aberration of rotation, arise and prevent effective utilization of the features of a lens having three magnetic pole pieces.

SUMMARY OF THE INVENTION

According to this invention, therefore, there is provided an electron lens which can eliminate or minimize radial and spiral distortions when an equal amount of excitation is applied to form the magnetic fields appearing in the first and second gaps between the magnetic pole pieces. The lens is characterized by the asymmetric configuration of the magnetic pole pieces, i.e., the middle and lower magnetic pole pieces have an equal bore diameter, and the upper magnetic pole pieces has a bore diameter which is 1.5 to 5 times larger than those of the middle and lower magnetic pole pieces. In this lens, radial distortion is reduced to zero at the excitation where focal length is minimum. At this excitation, spiral distortion is also reduced.

DRAWINGS

The invention will now be described in further detail with the accompanying drawings.

DESCRIPTION OF THE PREFERRED EMBODIMENT

Figure 3:
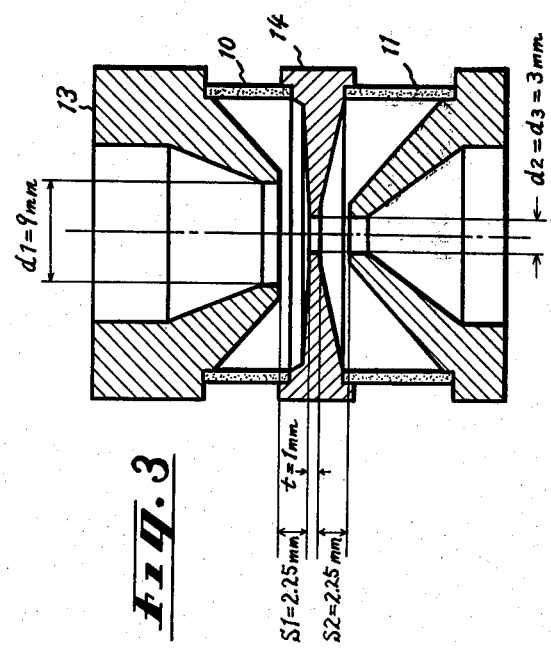
FIG. 3 is an essential part of one embodiment according to the invention.
Figure 2:
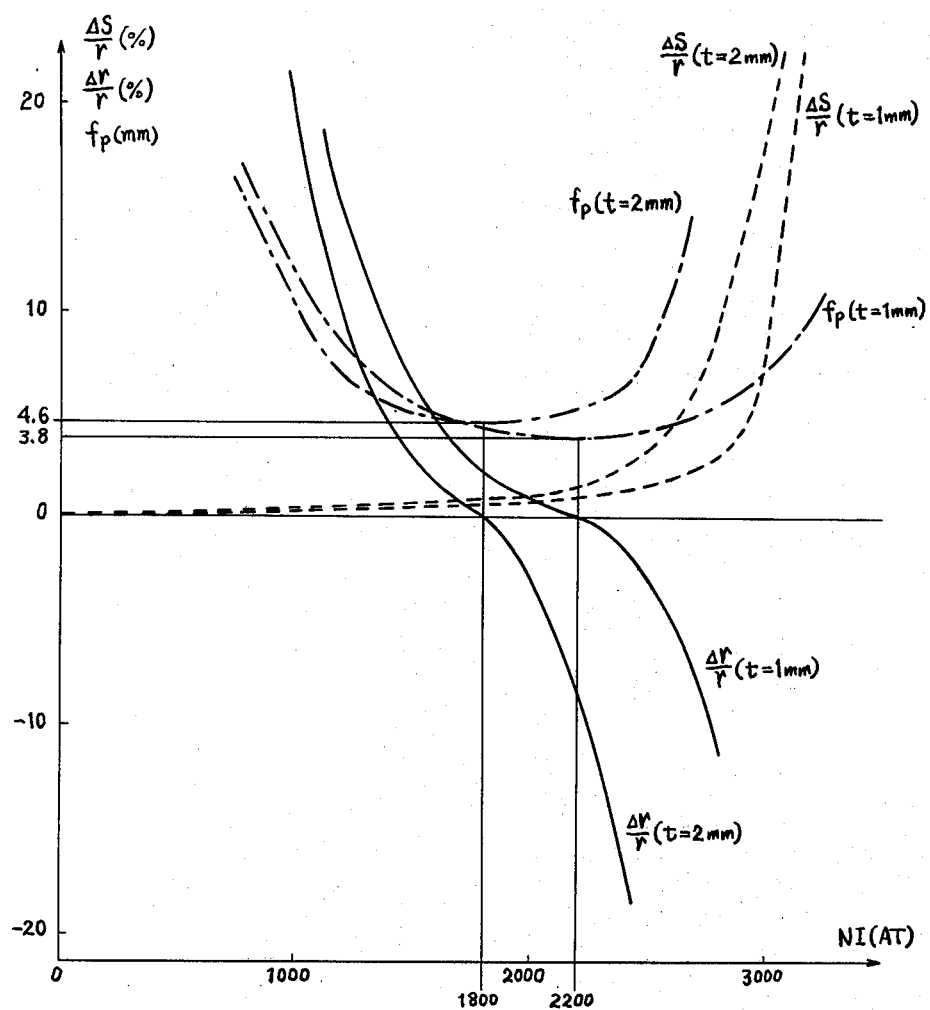
FIG. 2 is a graph for explaining the performance of the lens shown in FIG. 1.

FIG. 3 shows the essential part of one embodiment according to the invention. In this embodiment, an upper magnetic pole piece 13, a middle magnetic pole piece 14 and a lower magnetic pole piece 15 have bore diameters d1=9 mm, d2=3 mm and d3=3 mm, respectively, and the first pole piece gap S1 between the upper and middle pole pieces and the second pole piece gap S2 between the middle and lower pole pieces are both 2.25 mm, and the middle pole piece thickness t is 1 mm. In the above case and the modified case that the above d1 value is varied to 3 mm, 4.5 mm, 6 mm, the graph shown in FIG. 4 corresponding to FIG. 2 is measured. (Note the vertical scales are different, however.)

Figure 4:
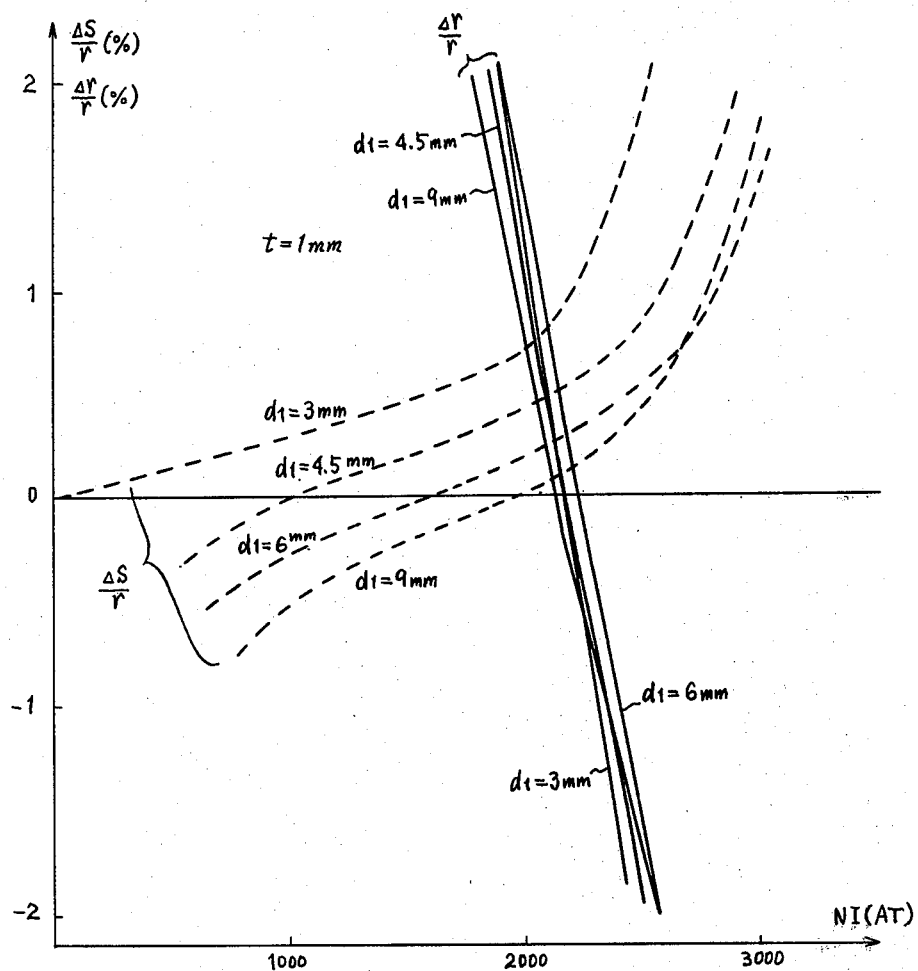

As is noted from FIG. 4, the radial distortion $\Delta r/r$ is not appreciably affected by the change in the bore diameter d1, but is less than 2% at an excitation NI in the range of 1,800 to 2,600 AT. Its value is zero at an excitation value in the vicinity of 2,200 AT. On the other hand, the spiral distortion $\Delta S/r$ depends largely on the bore diameter d1, and changes from negative to positive in relation to the increase of excitation with an increase in the bore diameter d1. Thus, the spiral distortion becomes zero when the excitation has a certain value. The excitation at which the aberration becomes zero increases with an increase in the bore diameter d1.

In the event the lens is used as a projector lens for a transmission electron microscope, it is desirable to use it at an excitation at which the radial distortion $\Delta r/r$ becomes zero (resulting in a minimum focal length fp); therefore, it is desirable to select the bore diameter d1 of the upper magnetic pole piece so that both the radial distortion $\Delta r/r$ and the spiral distortion $\Delta S/r$ may become zero.

Figure 5:
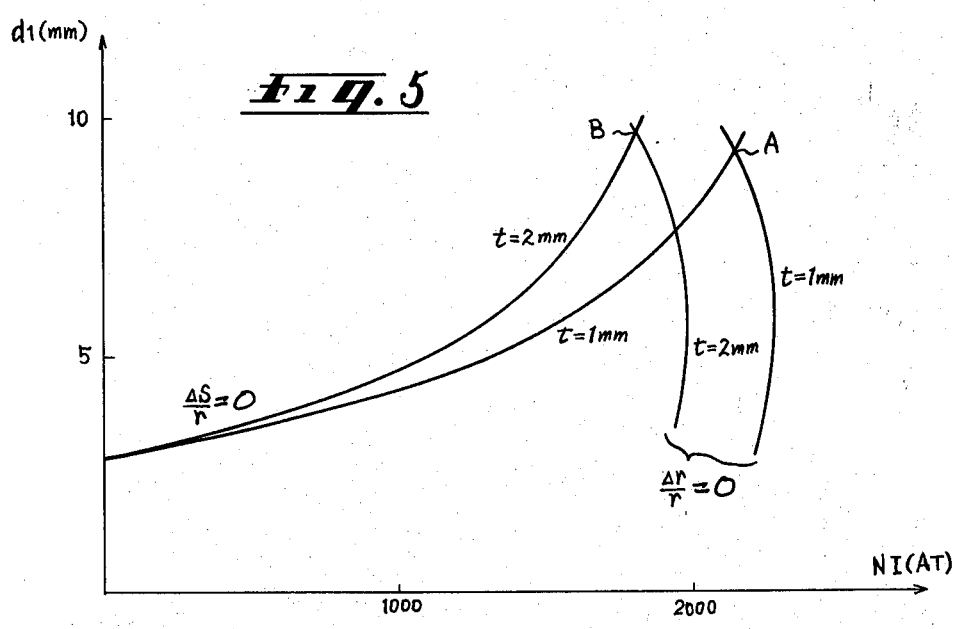

Referring to FIG. 5, the graph shows the bore diameter d1 of the upper magnetic pole piece in relation to the excitation NI at which both the radial distortion $\Delta r/r$ and the spiral distortion $\Delta S/r$ become zero, when the middle magnetic pole piece has a thickness t of 1 mm and 2 mm, respectively. It is noted that in both of the cases in which the thickness t is 1 mm and 2 mm, both of the aberrations become zero when the diameter d1 is between 9 mm and 10 mm, as shown at A and B in FIG. 5.

Figure 1:
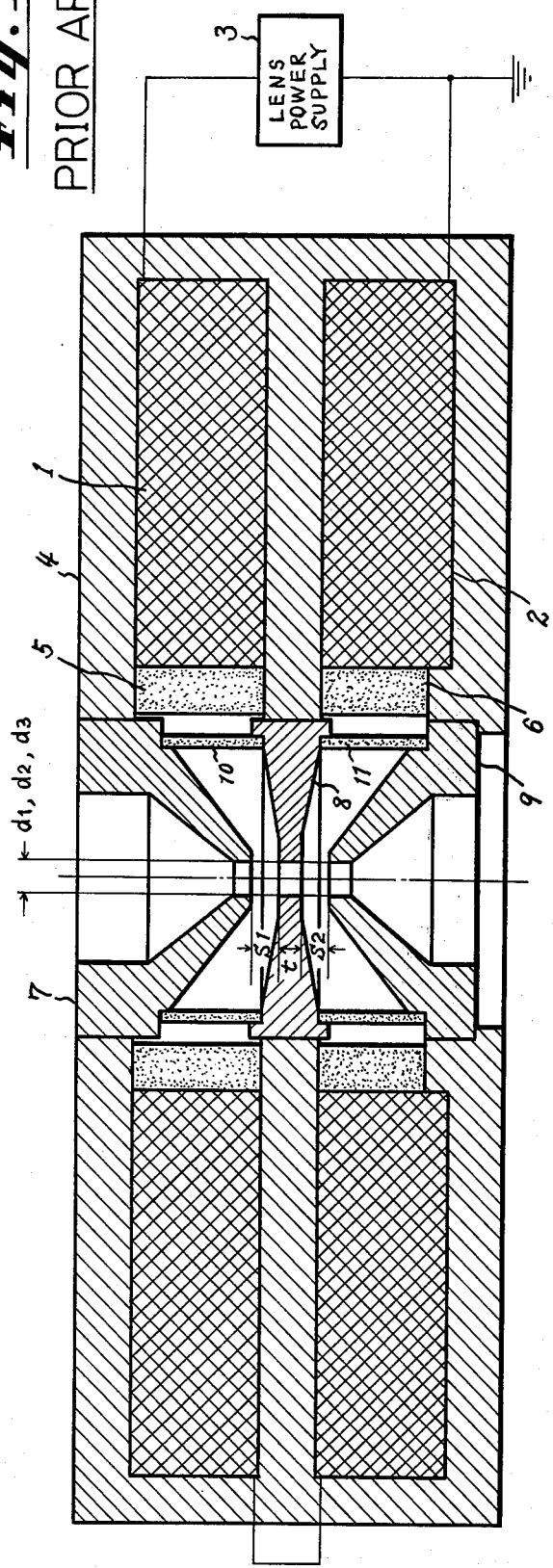
FIG. 1 is a schematic drawing showing a prior lens equipped with three magnetic pole pieces.
Figure 6:
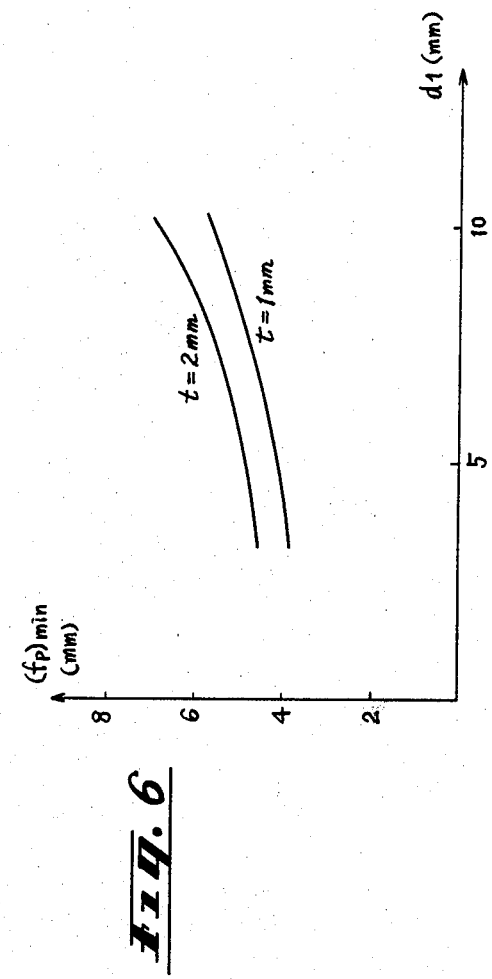
FIGS. 4 to 7 are graphs showing measurements of focal properties and radial and spiral distortion in the embodiments according to this invention.

FIG. 6 is a graph showing the minimum focal length $(fp)_{min}$ of the lenses having a middle pole piece thickness t 1 mm and 2 mm, respectively, in relation to the bore diameter d1 of the upper magnetic pole piece. The value of $(fp)_{min}$ is generally in the range of 4 to 6 mm, and with an increase in the diameter d1, it shows a slight increase which does not cause any substantial problem in practice.

Figure 7:
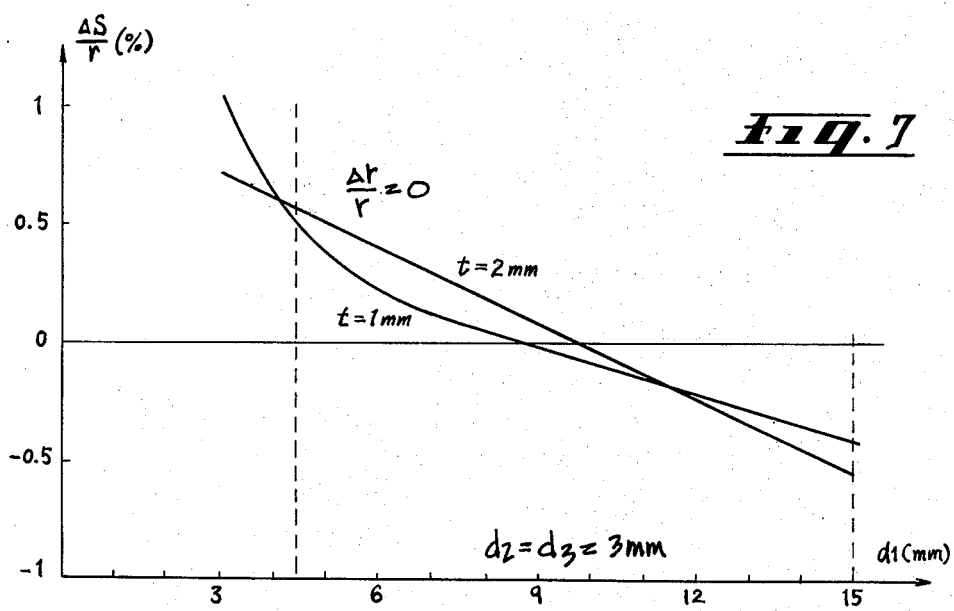

Attention is finally directed to FIG. 7 showing the spiral distortion $\Delta S/r$ at excitation at which the radial distortion $\Delta r/r$ is zero. It will be noted from the graph that when the radial distortion $\Delta r/r$ is zero, the spiral distortion $\Delta S/r$ can be reduced to 0.5% or less if the bore diameter d2 and d3 of the middle and lower magnetic pole pieces are equal to each other, and the bore diameter d1 of the upper magnetic pole piece is about 1.5 to 5 times larger than those of the middle and lower magnetic pole pieces. An optimum condition was found when the diameter d1 was three times larger than d2 or d3.

According to the construction of this invention as hereinabove described in detail, it is possible to obtain an electron lens which can eliminate radial distortion $\Delta r/r$ and reduce spiral distortion $\Delta S/r$ to zero or an extremely small value, and which is well suited for use as a projector lens for an electron microscope.

Although the invention has been described by way of example, it is equally possible to employ different values of d2, d3, S1, and S2 from those hereinabove mentioned to control each aberration so that it may show a generally similar tendency to what is shown in the drawings.

Radial distortion is sometimes referred to as isotropic distortion. An electron that leaves an object point $(X_o, Y_o)$ now intercepts the image plane at $(X_i, Y_i)$, where, for example, $$X_i = M[X_o + DX_o(X_o^2 + Y_o^2)]$$

$$Y_i = M[Y_o + DY_o(X_o^2 + Y_o^2)]$$

where M is the magnification and D is known as the distortion coefficient. A square will thuse be imaged as a barrel shaped body or pin cushioned shaped body depending on the sign of D.

Spiral distortion is sometimes known as anisotropic distortion. An electron that leaves an object point $(X_o, Y_o)$ now intercepts the image plane at $(X_i, Y_i)$, where, for example, $$X_i = M[X_o - dy_o(X_o^2 + Y_o^2)]$$

$$Y_i = M[Y_o + dx_o(X_o^2 + Y_o^2)]$$

where d is the anisotropic distortion coefficient. A square will be imaged into the pocket handkerchief shape.

As used in the specification and claims, the terms "upper" and "lower" pole pieces do not necessarily mean higher and lower relative to the ground level. The "upper" pole piece is that piece nearest the direction from which electrons approach the lens and the "lower" pole piece is nearest the direction to which electron exit the lens.

Having thus described the invention with the detail and particularity required by the Patent Laws, what is desired protected by Letters Patent is set forth in the following claims.

What is claimed is:

1. An electron lens consisting of upper, middle and lower magnetic pole pieces installed inside a yoke enveloping two excitation coils so that magnetic fields are generated with opposite and same strength excitation in the two gaps respectively between said three magnetic pole pieces, said middle and lower pole pieces have bores of substantially equal diameter and the bore diameter of said upper pole piece being 1.5 to 5 times larger than the bore diameters of the middle and lower pole pieces.

2. An electron lens of claim 1, wherein said two excitation coils are connected in series with respect to each other and supplied with the current from the same lens power supply.

3. The electron lens according to claim 1 wherein the bore diameter of the upper pole piece is approximately three times larger than the bore diameters of the middle and lower pole pieces.

4. The electron lens according to claims 1, 2, or 3 wherein the thickness of the middle pole piece adjacent the bore is about 1 to 2 mm.

5. The electron lens according to claims 1, 2, or 3 wherein the axial gaps between the upper and middle and middle and lower pole pieces are substantially the same.

* * * * *